United States Patent
Huang et al.

(10) Patent No.: US 8,253,500 B2
(45) Date of Patent: Aug. 28, 2012

(54) FREQUENCY-PHASE ADJUSTING DEVICE AND METHOD THEREOF

(75) Inventors: Liang-Wei Huang, Hsinchu (TW);
Ting-Fa Yu, Yunlin County (TW);
Ta-Chin Tseng, Taipei County (TW);
Li-Wei Fang, Taichung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 41 days.

(21) Appl. No.: 12/841,144

(22) Filed: Jul. 21, 2010

(65) Prior Publication Data
US 2011/0018641 A1    Jan. 27, 2011

(30) Foreign Application Priority Data
Jul. 22, 2009   (TW) ................................ 98124723 A

(51) Int. Cl.
*H03L 7/085* (2006.01)
(52) U.S. Cl. ................ 331/34; 331/16; 331/17; 331/25; 327/155
(58) Field of Classification Search ............... 331/16, 331/17, 34, 25; 327/155–156; 375/373, 375/376
See application file for complete search history.

(56) References Cited

U.S. PATENT DOCUMENTS

| | | | | |
|---|---|---|---|---|
| 5,546,433 A * | 8/1996 | Tran et al. | | 375/376 |
| 5,572,558 A * | 11/1996 | Beherns | | 375/376 |
| 7,304,545 B1 | 12/2007 | Sutardja | | |
| 7,382,200 B2 * | 6/2008 | Staszewski et al. | | 331/16 |
| 7,538,620 B1 * | 5/2009 | Hu et al. | | 331/14 |
| 7,821,958 B2 * | 10/2010 | Smith et al. | | 370/252 |
| 7,893,775 B2 * | 2/2011 | Luiz et al. | | 331/25 |
| 2009/0243735 A1 | 10/2009 | Luiz et al. | | |

* cited by examiner

*Primary Examiner* — Levi Gannon
(74) *Attorney, Agent, or Firm* — Thomas, Kayden, Horstemeyer & Risley, LLP

(57) ABSTRACT

A frequency-phase adjusting device includes a first controller, a second controller, and an oscillating circuit. The first controller generates a first control signal according to a target frequency and a current frequency. The second controller generates a second control signal according to the first control signal, wherein the second control signal is related to a first frequency difference, a second frequency difference, and a designated duration. The oscillating circuit adjusts the current frequency according to the first frequency difference, the second frequency difference, and the designated duration. The current frequency is set as a first frequency during a first duration, set as a second frequency during the designated duration, and set as a third frequency during a second duration. The first frequency difference equals a difference between the first frequency and the second frequency, and the second frequency difference equals a difference between the second frequency and the third frequency.

13 Claims, 4 Drawing Sheets

FREQUENCY-PHASE ADJUSTING DEVICE AND METHOD THEREOF

BACKGROUND OF THE INVENTION

1. Field of the Invention

The present invention relates to a frequency-phase adjusting device and a related method, and more particularly, to a device and method for lowering instantaneous maximum error and for solving vibration problems by adjusting its frequency and phase at the same time.

2. Description of the Prior Art

Using an oscillator to oscillate an initial frequency and then using a phase locked loop (PLL), a voltage-controlled oscillator (VCO), a digital-controlled oscillator (DCO), or an all digital phase locked loop (ADPLL) to control and generate a desired frequency and phase for a system is a familiar technique. Herein the VCO, the DCO, or the ADPLL is used for providing a digital control code or a control voltage to an analog circuit, so as to generate the corresponding frequency and phase.

In a communication system, demands of catching up the remote-end frequency and phase are often encountered. When using a conventional PLL, it is necessary to catch up the remote-end phase first and then catch up the remote-end frequency by jumping phase. However, at that moment of jumping phase, the received echo/near-end crosstalk of the analog-to-digital converter is corresponding to a current phase, but the echo/near-end crosstalk eliminated by the echo/near-end crosstalk canceller is corresponding to a previous phase, therefore, an instantaneous maximum error occurs, which results in a poor system performance. If a conventional VCO, DCO, or ADPLL is adopted, catching up the remote-end frequency first is necessary. Due to the phase error existing between the both ends, it must catch up with the phase of the opposite side by means of tuning up/tuning down its frequency. By the time when the phase of the opposite side is caught up, its frequency becomes not the same as the opposite side at this time. Hence, the action of tuning down/tuning up its frequency is required once more. For this reason, a vibration phenomenon will easily happen in the system, which may cause a system breakdown.

SUMMARY OF THE INVENTION

It is therefore one of the objectives of the claimed invention to provide a frequency-phase adjusting device and a related method to solve the abovementioned problems.

According to an exemplary embodiment of the present invention, a frequency-phase adjusting device is provided. The frequency-phase adjusting device consists of a first controller, a second controller, and an oscillating circuit. The first controller generates a first control signal according to a target frequency and a current frequency. The second controller is coupled to the first controller for generating a second control signal according to the first control signal, wherein the second control signal is used for deciding a first frequency difference, a designated duration, and a second frequency difference. The oscillating circuit is coupled to the second controller for adjusting the current frequency according to the first frequency difference, the designated duration, and the second frequency difference. The current frequency of a first duration is set as a first frequency; the current frequency of the designated duration is set as a second frequency; the current frequency of a second duration is set as a third frequency; the first frequency difference is equal to a frequency difference between the first frequency and the second frequency; and the second frequency difference is equal to a frequency difference between the second frequency and the third frequency; and the first duration, the designated duration and the second duration are continuous time periods in turn. The oscillating circuit can be a voltage-controlled oscillator, a digital-controlled oscillator, or an all digital phase locked loop.

According to another exemplary embodiment of the present invention, a method for adjusting frequency and phase is provided. The method includes the steps of: generating a first control signal according to a target frequency and a current frequency; generating a second control signal according to the first control signal, wherein the second control signal is used for deciding a first frequency difference, a designated duration, and a second frequency difference; and adjusting the current frequency according to the first frequency difference, the designated duration, and the second frequency difference. Be noted that the current frequency of a first duration is set as a first frequency; the current frequency of a designated duration is set as a second frequency; the current frequency of a second duration is set as a third frequency; the first frequency difference is equal to a frequency difference between the first frequency and the second frequency; and the second frequency difference is equal to a frequency difference between the second frequency and the third frequency; and the first duration, the designated duration, and the second duration are continuous time periods in turn.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
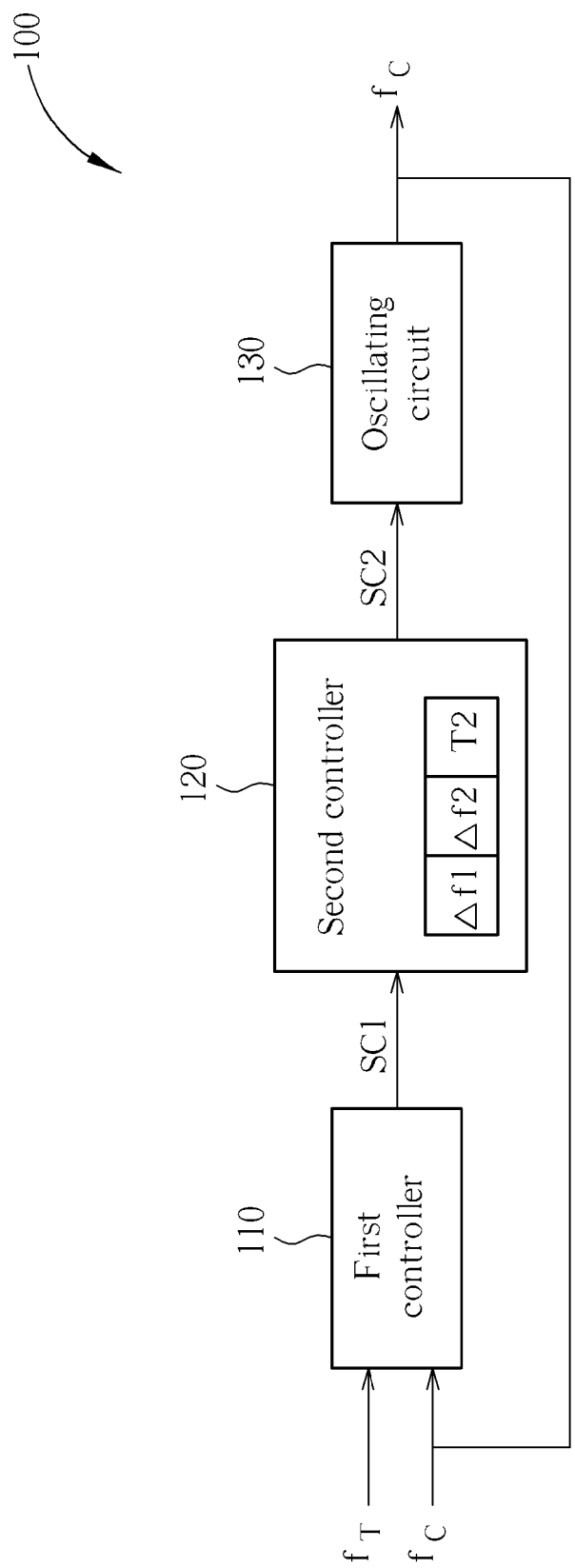
FIG. 1 is a block diagram showing a frequency-phase adjusting device according to an embodiment of the present invention.

Please refer to FIG. 1. FIG. 1 is a block diagram showing a frequency-phase adjusting device 100 according to an embodiment of the present invention. As shown in FIG. 1, the frequency-phase adjusting device 100 consists of, but is not limited to, a first controller 110, a second controller 120, and an oscillating circuit 130. The first controller 110 generates a first control signal SC1 according to a target frequency $f_T$ and a current frequency $f_C$. The second controller 120 is coupled to the first controller 110 for generating a second control signal SC2 according to the first control signal SC1, wherein the second control signal SC2 is related to a first frequency difference $\Delta f1$, a designated duration T2, and a second frequency difference $\Delta f2$. The oscillating circuit 130 is coupled to the second controller 120 for adjusting the current frequency $f_C$ according to the second control signal SC2 (which is used for deciding the first frequency difference $\Delta f1$, the designated duration T2, and the second frequency difference Δf2). Operations for illustrating how the second controller 120 decides the above-mentioned parameters (including the first frequency difference Δf1, the designated duration T2, and the second frequency difference Δf2), so as to adjust the current frequency $f_C$ of the oscillating circuit 130 will be detailed in the embodiments below.

In this embodiment, the oscillating circuit 130 can be a voltage-controlled oscillator (VCO), a digital-controlled oscillator (DCO), or an all digital phase locked loop (AD-PLL). But the present invention is not limited to this only, and the oscillating circuit 130 can be an oscillator of other types. Operations and details of the VCO, DCO, and ADPLL are already well-known to those skilled in the art, and thus further description is omitted here for brevity. Furthermore, the first controller 110 can be implemented by adopting at least one of the following components: a proportional controller, an integral controller, and a derivative controller; but this should not be considered as limitations of the present invention.

Figure 2:
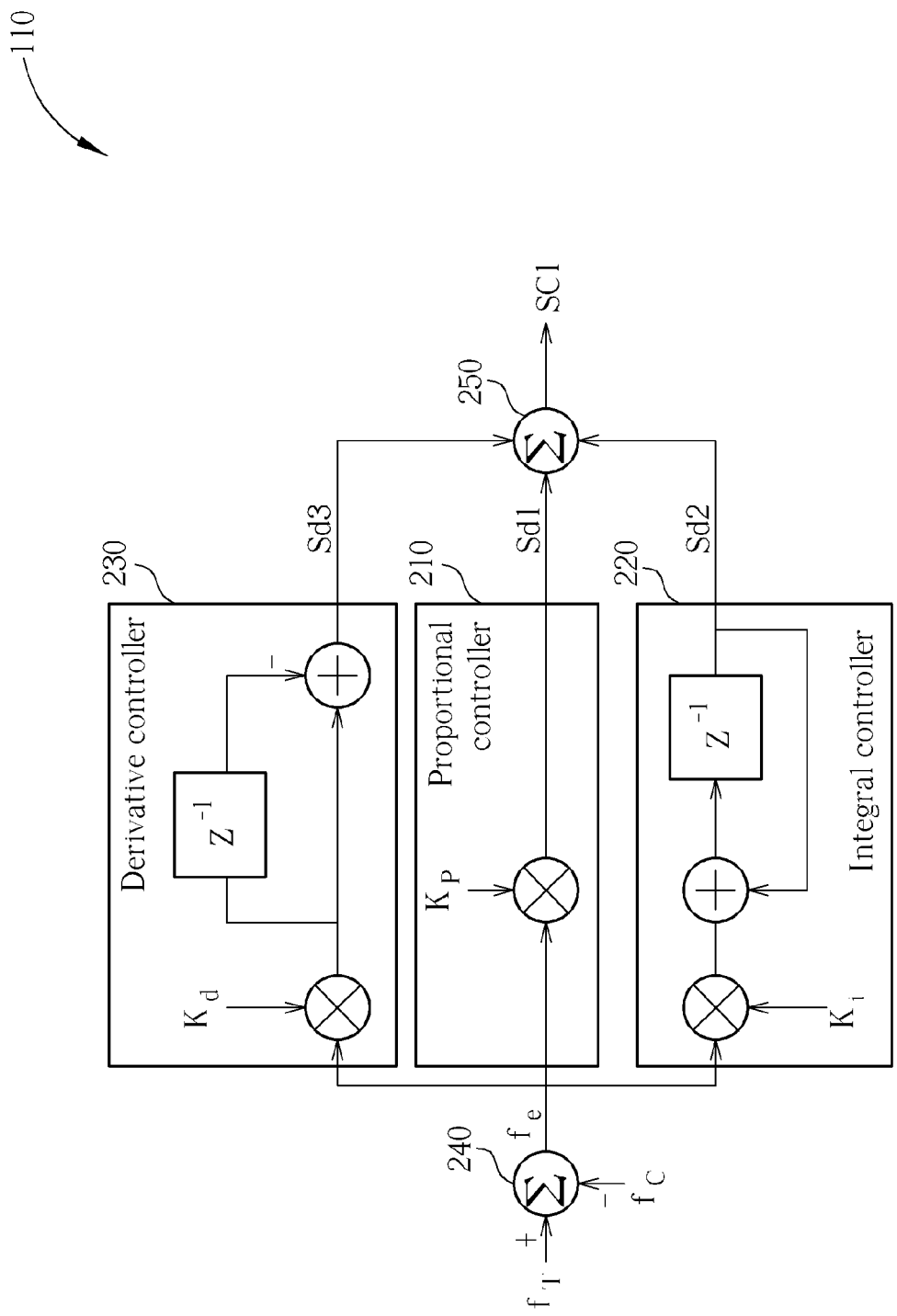
FIG. 2 is a diagram illustrating an exemplary embodiment of the first controller shown in FIG. 1.

Please refer to FIG. 2. FIG. 2 is a diagram illustrating an exemplary embodiment of the first controller 110 shown in FIG. 1. AS shown in FIG. 2, the first controller 110 consists of a proportional controller 210, an integral controller 220, a derivative controller 230, a first adder 240, and a second adder 250. A mathematical model of the first controller 110 can be represented as below:

$$u(t) = K_p \times e(t) + K_i \times \int_0^t e(\tau)d\tau + K_d \times \frac{de(t)}{dt}; \quad (1)$$

Herein "e(t)" is representative of a frequency error $f_e$ generated by performing an addition operation (e.g. a subtraction) upon the target frequency $f_T$ and the current frequency $f_C$ via the first adder 240; furthermore, Kp, Ki, and Kd respectively represent a proportional gain of the proportional controller 210, an integral gain of the integral controller 220, and a derivative gain of the derivative controller 230, wherein all of Kp, Ki, and Kd are smaller than 1. From FIG. 2, we can see that after the frequency error $f_e$ is respectively processed by the proportional controller 210, the integral controller 220, and the derivative controller 230, their operating results Sd1, Sd2, and Sd3 can be obtained. Finally, the second adder 250 adds up the obtained operating results Sd1, Sd2, and Sd3, so as to generate the first control signal SC1 to the back-end second controller 120.

Please note that generally in use, the proportional controller 210, the integral controller 220, and the derivative controller 230 are not needed to be simultaneously used. For example, the first controller 110 can be implemented by adopting the proportional controller 210 and the integral controller 220; or the first controller 110 can be implemented by adopting the proportional controller 210 only. In other words, at least one of the proportional controller 210, the integral controller 220, and the derivative controller 230 can be adopted to implement the first controller 110.

Figure 3:
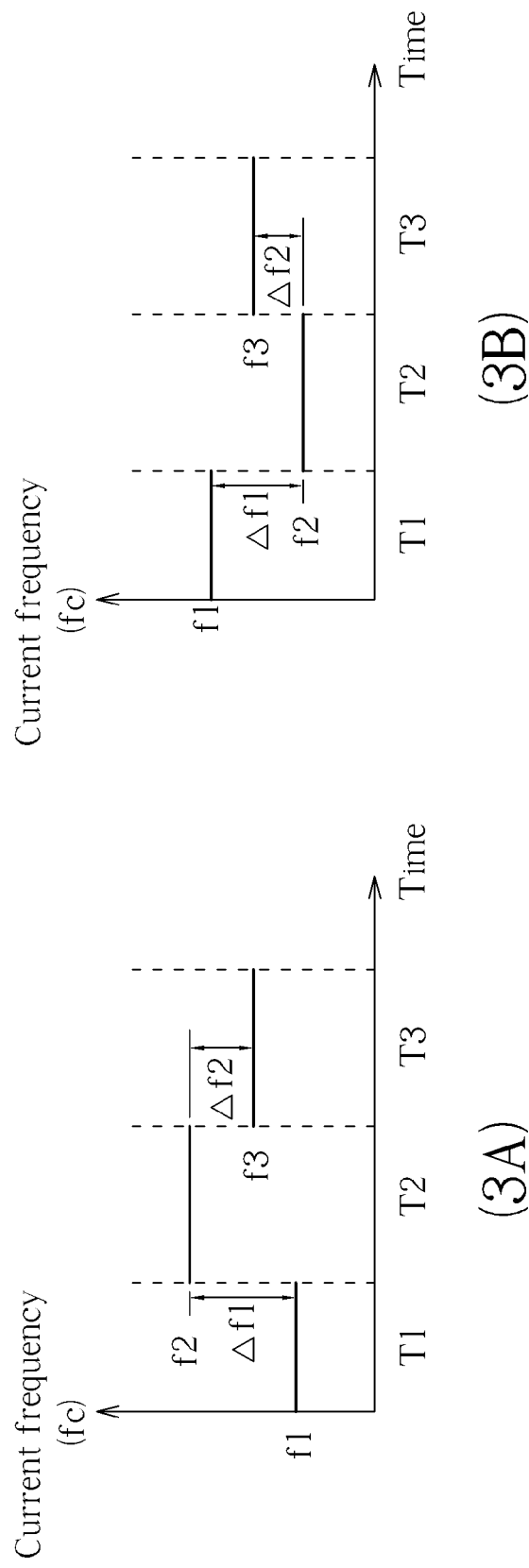
FIG. 3 (including 3A and 3B) is a diagram illustrating how the second controller shown in FIG. 1 decides the first frequency difference, the designated duration, and the second frequency difference in order to adjust the current frequency of the oscillating circuit.

Please refer to FIG. 3. FIG. 3 (including 3A and 3B) is a diagram illustrating how the second controller 120 shown in FIG. 1 generates the second control signal SC2 according to the first control signal SC1 for deciding the first frequency difference Δf1, the designated duration T2, and the second frequency difference Δf2 in order to adjust the current frequency $f_C$ of the oscillating circuit 130. During a duration T1, the second control signal SC2 is indicative of setting the current frequency $f_C$ as a first frequency f1; during the designated duration T2 immediately after the duration T1, the second control signal SC2 is indicative of setting the current frequency $f_C$ as a second frequency f2; and during a duration T3 immediately after the designated duration T2, the second control signal SC2 is indicative of setting the current frequency $f_C$ as a third frequency f3. In addition, the first frequency difference Δf1 is equal to a frequency difference between the first frequency f1 and the second frequency f2; and the second frequency difference Δf2 is equal to a frequency difference between the second frequency f2 and the third frequency f3.

If the target frequency $f_T$ is greater than the current frequency $f_C$ (or the target phase is ahead of the current phase), the current frequency $f_C$ needs to be increased so as to catch up with the target frequency $f_T$. As shown in FIG. 3A, the current frequency $f_C$ is originally at the first frequency f1 during the duration T1. At this time, the second controller 120 outputs the second control signal SC2 for deciding the first frequency difference Δf1, such that the current frequency $f_C$ is increased from the first frequency f1 to the second frequency f2 (i.e., f2>f1). During the designated duration T2, the second controller 120 outputs the second control signal SC2 for maintaining the current frequency $f_C$ at the second frequency f2 so as to simultaneously catch up with the target phase. For the time being, the phase variation of the current phase is equal to Δf1×T2. After that, the second controller 120 outputs the second control signal SC2 for deciding the second frequency difference Δf2, such that the current frequency $f_C$ is decreased from the second frequency f2 to the third frequency f3, wherein the third frequency f3 is in between the first frequency f1 and the second frequency f2 (i.e., f2>f3>f1). Since the third frequency f3 is greater than the first frequency f1, the current frequency $f_C$ can catch up with the target frequency $f_T$ step by step. Therefore, in this way, the current frequency $f_C$ can be increased while the phase can be caught up with the target phase at the same time.

On the other hand, if the target frequency $f_T$ is smaller than the current frequency $f_C$ (or the target phase falls behind the current phase), the current frequency $f_C$ needs to be decreased. As shown in FIG. 3B, the current frequency $f_C$ is originally at the first frequency f1 during the duration T1. At this time, the second controller 120 outputs the second control signal SC2 for deciding the first frequency difference Δf1, such that the current frequency $f_C$ is decreased from the first frequency f1 to the second frequency f2 (f1>f2). During the designated duration T2, the second controller 120 outputs the second control signal SC2 for maintaining the current frequency $f_C$ at the second frequency f2 so as to simultaneously slow down the current phase. For the time being, the phase variation of the current phase is equal to Δf1×T2. After that, the second controller 120 outputs the second control signal SC2 for deciding the second frequency difference Δf2, such that the current frequency $f_C$ is increased from the second frequency f2 to the third frequency f3, wherein the third frequency f3 is in between the first frequency f1 and the second frequency f2 (i.e., f1>f3>f2). Since the third frequency f3 is smaller than the first frequency f1, the current frequency $f_C$ can gradually come close to the target frequency $f_T$. Therefore, in this way, the current frequency $f_C$ can be decreased while the phase can be decreased toward the target phase at the same time.

What calls for special attention is that the aforementioned parameters: the first frequency difference Δf1, the designated duration T2, and the second frequency difference Δf2 are not fixed, and they can be correspondingly adjusted depending on actual demands. What's more, in a convergence mode, the first frequency difference Δf1, the designated duration T2, and the second frequency difference Δf2 can be set to have greater values, such that the convergence time can be sped up. When the current frequency $f_C$ has already come close to the target frequency $f_T$, the frequency-phase adjusting device 100 is controlled to enter a tracking mode. At this time, the first frequency difference Δf1, the designated duration T2, and the second frequency difference Δf2 are set to have smaller values. Therefore, a balance between the instantaneous maximum error as well as the vibration phenomenon can be achieved in order to minimize the total error.

In short, the frequency-phase adjusting device 100 disclosed in the present invention can control the parameters of: the first frequency difference Δf1, the designated duration T2, and the second frequency difference Δf2 by means of the second controller 120, such that the current frequency as well as the current phase can be simultaneously adjusted. Compared with the prior art, an instantaneous maximum error is occurs if a conventional phase locked loop (PLL) is adopted for catching up with the phase; otherwise, if a conventional VCO, DCO, or ADPLL is adopted for catching up with the frequency, a system vibration problem will happen. For all the reasons above, by adopting the frequency-phase adjusting device 100 disclosed in the present invention, the aforementioned instantaneous maximum error as well as the vibration problem can be simultaneously solved. It is clear, therefore, that all influences can be lowered to the minimum so as to improve its overall performance.

Certainly, the abovementioned embodiments are presented merely to illustrate practicable designs of the present invention, and in no way should be considered to be limitations of the scope of the present invention. Those skilled in the art should appreciate that various modifications of the second controller 120 may be made without departing from the spirit of the present invention, which also belongs to the scope of the present invention.

Figure 4:
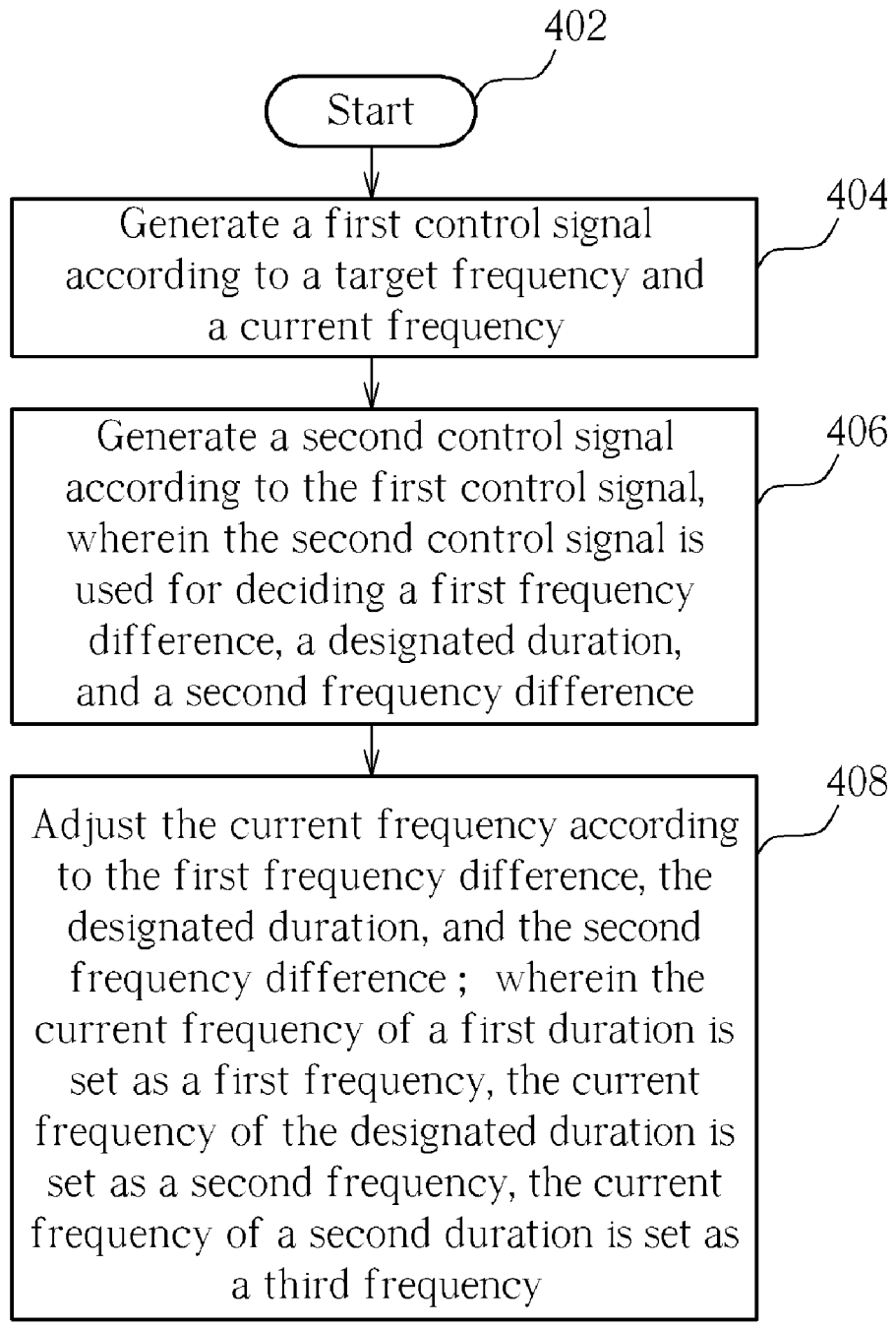
FIG. 4 is a flowchart illustrating a method for adjusting frequency and phase according to an exemplary embodiment of the present invention.

Please refer to FIG. 4. FIG. 4 is a flowchart illustrating a method for adjusting frequency and phase according to an exemplary embodiment of the present invention. Please note that the following steps are not limited to be performed according to the exact sequence shown in FIG. 4 if a roughly identical result can be obtained. The method includes, but is not limited to, the following steps:

Step 402: Start.

Step 404: Generate a first control signal according to a target frequency and a current frequency.

Step 406: Generate a second control signal according to the first control signal, wherein the second control signal is used for deciding a first frequency difference, a designated duration, and a second frequency difference.

Step 408: Adjust the current frequency according to the first frequency difference, the designated duration, and the second frequency difference; wherein the current frequency of a first duration is set as a first frequency, the current frequency of the designated duration is set as a second frequency, the current frequency of a second duration is set as a third frequency.

How each element operates can be known by collocating the steps shown in FIG. 4, the elements shown in FIG. 1, together with the figure shown in FIG. 3, and further description is omitted here for brevity. The step 404 is executed by the first controller 110, the step 406 is executed by the second controller 120, and the step 408 is executed by the oscillating circuit 130. Be noted that, in step S408, the setting values of the current frequency $f_C$ during the duration T1, the designated duration T2, and the duration T3 are also shown in FIG. 3 (including 3A and 3B).

Please note that, the steps of the abovementioned flowchart are merely practicable embodiments of the present invention, and is not meant to be considered to be limitations of the scope of the present invention. The method can include other intermediate steps or several steps can be merged into a single step without departing from the spirit of the present invention.

The abovementioned embodiments are presented merely for describing the features of the present invention, and in no way should be considered to be limitations of the scope of the present invention. In summary, the present invention provides a frequency-phase adjusting device and a related method for adjusting frequency and phase. These parameters, such as the first frequency difference Δf1, the designated duration T2, and the second frequency difference Δf2, can be controlled by using the second control signal SC2 of the second controller 120, such that the current frequency as well as the current phase can be adjusted at the same time in order to solve the instantaneous maximum error and the vibration problem. Moreover, the abovementioned parameters can be adjusted depending on actual demands. For example, in a convergence mode, the first frequency difference Δf1, the designated duration T2, and the second frequency difference Δf2 can be designed to have greater values, such that the convergence time can be sped up. In a tracking mode, the first frequency difference Δf1, the designated duration T2, and the second frequency difference Δf2 are designed to have smaller values. As a result, a balance between the instantaneous maximum error as well as the vibration phenomenon can be achieved in order to minimize the total error. What's more, the frequency-phase adjusting device disclosed in the present invention has a simple architecture, which can be easily implemented.

Those skilled in the art will readily observe that numerous modifications and alterations of the device and method may be made while retaining the teachings of the invention.

What is claimed is:

1. A frequency-phase adjusting device, comprising:
a first controller, generating a first control signal according to a target frequency and a current frequency;
a second controller, coupled to the first controller, generating a second control signal according to the first control signal, wherein the second control signal is used for deciding a first frequency difference, a designated duration, and a second frequency difference; and
an oscillating circuit, coupled to the second controller, adjusting the current frequency according to the first frequency difference, the designated duration, and the second frequency difference;
wherein the current frequency of a first duration is set as a first frequency; the current frequency of the designated duration is set as a second frequency; the current frequency of a second duration is set as a third frequency; the first frequency difference is equal to a frequency difference between the first frequency and the second frequency; the second frequency difference is equal to a frequency difference between the second frequency and the third frequency, and the first duration, the designated duration, and the second duration are continuous time periods in turn.

2. The frequency-phase adjusting device of claim 1, wherein the third frequency is between the first frequency and the second frequency, and the second frequency difference is smaller than the first frequency difference.

3. The frequency-phase adjusting device of claim 1, wherein when the target frequency is greater than the current frequency, the first frequency is smaller than the third frequency, and the third frequency is smaller than the second frequency.

4. The frequency-phase adjusting device of claim 1, wherein when the target frequency is smaller than the current frequency, the first frequency is greater than the third frequency, and the third frequency is greater than the second frequency.

5. The frequency-phase adjusting device of claim 1, wherein a value of the first frequency difference in a convergence mode is greater than the value of the first frequency difference in a tracking mode; a value of the designated duration in the convergence mode is greater than the value of the designated duration in the tracking mode; and a value of the second frequency difference in the convergence mode is greater than the value of the second frequency difference in the tracking mode.

6. The frequency-phase adjusting device of claim 1, wherein the first controller comprises at least one of a proportional controller, an integral controller, and a derivative controller.

7. The frequency-phase adjusting device of claim 1, wherein the oscillating circuit is a voltage-controlled oscillator (VCO), a digital-controlled oscillator (DCO), or an all digital phase locked loop (ADPLL).

8. A method for adjusting frequency and phase, comprising:
   generating a first control signal according to a target frequency and a current frequency;
   generating a second control signal according to the first control signal, wherein the second control signal is used for deciding a first frequency difference, a designated duration, and a second frequency difference; and
   adjusting the current frequency according to the first frequency difference, the designated duration, and the second frequency difference;
   wherein the current frequency of a first duration is set as a first frequency; the current frequency of the designated duration is set as a second frequency; the current frequency of a second duration is set as a third frequency; the first frequency difference is equal to a frequency difference between the first frequency and the second frequency; the second frequency difference is equal to a frequency difference between the second frequency and the third frequency, and the first duration, the designated duration, and the second duration are continuous time periods in turn.

9. The method of claim 8, wherein the third frequency is between the first frequency and the second frequency, and the second frequency difference is smaller than the first frequency difference.

10. The method of claim 8, wherein when the target frequency is greater than the current frequency, the first frequency is smaller than the third frequency, and the third frequency is smaller than the second frequency.

11. The method of claim 8, wherein when the target frequency is smaller than the current frequency, the first frequency is greater than the third frequency, and the third frequency is greater than the second frequency.

12. The method of claim 8, wherein a value of the first frequency difference in a convergence mode is greater than the value of the first frequency difference in a tracking mode; a value of the designated duration in the convergence mode is greater than the value of the designated duration in the tracking mode; and a value of the second frequency difference in the convergence mode is greater than the value of the second frequency difference in the tracking mode.

13. The method of claim 8, being applied to a voltage-controlled oscillator (VCO), a digital-controlled oscillator (DCO), or an all digital phase locked loop (ADPLL).

* * * * *